(12) United States Patent
Takenouchi

(10) Patent No.: US 10,930,558 B2
(45) Date of Patent: Feb. 23, 2021

(54) PROCESSING APPARATUS

(71) Applicant: DISCO CORPORATION, Tokyo (JP)

(72) Inventor: Kenji Takenouchi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/252,023

(22) Filed: Jan. 18, 2019

(65) Prior Publication Data

US 2019/0229018 A1 Jul. 25, 2019

(30) Foreign Application Priority Data

Jan. 22, 2018 (JP) .............................. JP2018-007981

(51) Int. Cl.
| | | |
|---|---|---|
| *H01L 21/78* | (2006.01) | |
| *H01L 21/67* | (2006.01) | |
| *B28D 5/04* | (2006.01) | |
| *B28D 5/02* | (2006.01) | |
| *B26D 7/08* | (2006.01) | |

(52) U.S. Cl.
CPC ............... *H01L 21/78* (2013.01); *B26D 7/08* (2013.01); *B28D 5/022* (2013.01); *B28D 5/047* (2013.01); *H01L 21/67092* (2013.01); *H01L 21/67115* (2013.01)

(58) Field of Classification Search
CPC ............... H01L 21/78; H01L 21/67115; H01L 21/67092; B28D 5/047; B28D 5/022; B26D 7/08

See application file for complete search history.

(56) References Cited

U.S. PATENT DOCUMENTS

| | | | | |
|---|---|---|---|---|
| 6,221,167 B1* | 4/2001 | Karasawa | ................. | B08B 3/10 |
| | | | | 134/1 |
| 2003/0108823 A1* | 6/2003 | Muraoka | ................. | G03F 7/423 |
| | | | | 430/329 |
| 2011/0042291 A1* | 2/2011 | Yoshida | ................. | C02F 9/005 |
| | | | | 210/202 |
| 2015/0262881 A1* | 9/2015 | Takenouchi | ............ | H01L 21/78 |
| | | | | 438/460 |

FOREIGN PATENT DOCUMENTS

JP 2015177089 A 10/2015

* cited by examiner

*Primary Examiner* — Kyoung Lee
*Assistant Examiner* — Christina A Sylvia
(74) *Attorney, Agent, or Firm* — Greer Burns & Crain, Ltd.

(57) ABSTRACT

A processing apparatus includes: a holding unit that holds a workpiece; a processing mechanism that processes the workpiece held by the holding unit; a processing liquid supplying mechanism that supplies a processing liquid containing an oxidizing agent to at least the workpiece held by the holding unit at the time of processing the workpiece by the processing means; a processing waste liquid recovery section that recovers a processing waste liquid containing the processing liquid supplied from the processing liquid supplying mechanism to the workpiece; a discharge passage through which the processing waste liquid is discharged from the processing waste liquid recovery section to the outside of the processing apparatus; and a waste liquid treatment mechanism that is disposed in the discharge passage and that decomposes the processing liquid contained in the processing waste liquid while the processing waste liquid flows through the discharge passage.

7 Claims, 4 Drawing Sheets

PROCESSING APPARATUS

BACKGROUND OF THE INVENTION

Field of the Invention

The present invention relates to a processing apparatus such as a cutting apparatus, a grinding apparatus and a cutting tool cutting apparatus in which a workpiece is processed while supplying a processing liquid.

Description of the Related Art

When a workpiece having a metal is cut by a cutting blade, clogging of the cutting blade is generated, and burring is generated at the metal part. This leads to the problem that the generated burrs may cause short-circuit between terminals of devices formed in the workpiece, or the burrs may drop onto bonding pads during handling of the workpiece, to cause defective bonding.

In order to solve this problem, Japanese Patent Laid-open No. 2015-177089 proposes a method of cutting a workpiece while supplying a cutting liquid containing an organic acid and an oxidizing agent. According to this cutting method, the organic acid contained in the cutting liquid modifies the metal, thereby suppressing the ductility of the metal. As a result, burring is restrained. In addition, since the cutting liquid contains the oxidizing agent, the property of a film formed on the metal surface is changed by the cutting liquid, whereby the metal is made to lose ductility and to become easy to remove, so that processability is enhanced.

SUMMARY OF THE INVENTION

Depending on the waste water quality standards in the area in which the cutting apparatus is used, however, it is impossible for the cutting waste liquid containing the cutting liquid to be discharged as it is. In practice, therefore, the cutting waste liquid is discharged, for example, after the organic matter in the cutting waste liquid is decomposed by a biological treatment using microorganisms.

When the cutting liquid contains an oxidizing agent, however, the microorganisms used in the biological treatment may be killed by the oxidizing agent, and the organic matter in the cutting waste liquid cannot be decomposed, which leads to the risk of discharging a cutting waste liquid not satisfying the waste water quality standards. Such a problem is not limited to a cutting apparatus, and is generated in the cases of other processing apparatuses such as a grinding apparatus, and a cutting tool cutting apparatus in which a processing liquid is used.

Accordingly, it is an object of the present invention to provide a processing apparatus with which it is possible to lower the risk of discharging a processing waste liquid not satisfying the waste water quality standards.

In accordance with an aspect of the present invention, there is provided a processing apparatus including: holding means holding a workpiece; processing means processing the workpiece held by the holding means; processing liquid supplying means supplying a processing liquid containing at least an oxidizing agent to the workpiece at the time of processing the workpiece held by the holding means by the processing means; a processing waste liquid recovery section that recovers a processing waste liquid containing the processing liquid supplied from the processing liquid supplying means to the workpiece; a discharge passage through which the processing waste liquid is discharged from the processing waste liquid recovery section to the outside of the processing apparatus; and a waste liquid treatment mechanism that is disposed in the discharge passage and that decomposes the processing liquid contained in the processing waste liquid while the processing waste liquid flows through the discharge passage.

Preferably, the oxidizing agent is hydrogen peroxide, and the waste liquid treatment mechanism includes ultraviolet (UV) ray irradiation means irradiating the processing waste liquid with UV rays.

The processing apparatus of the present invention, which includes the waste liquid treatment mechanism that is disposed in the discharge passage and that decomposes the processing liquid contained in the processing waste liquid, is able to lower the risk of discharging a processing waste liquid not satisfying the waste water quality standards.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
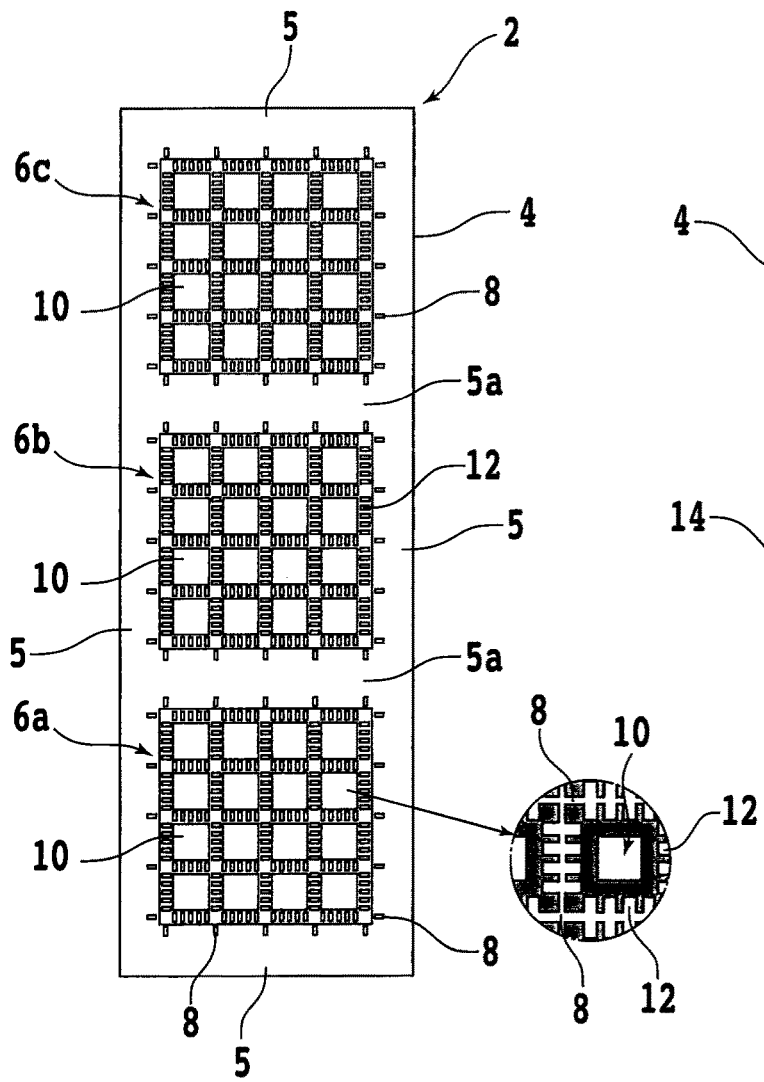
FIG. 1A is a plan view of a package substrate.
Figure 1B:
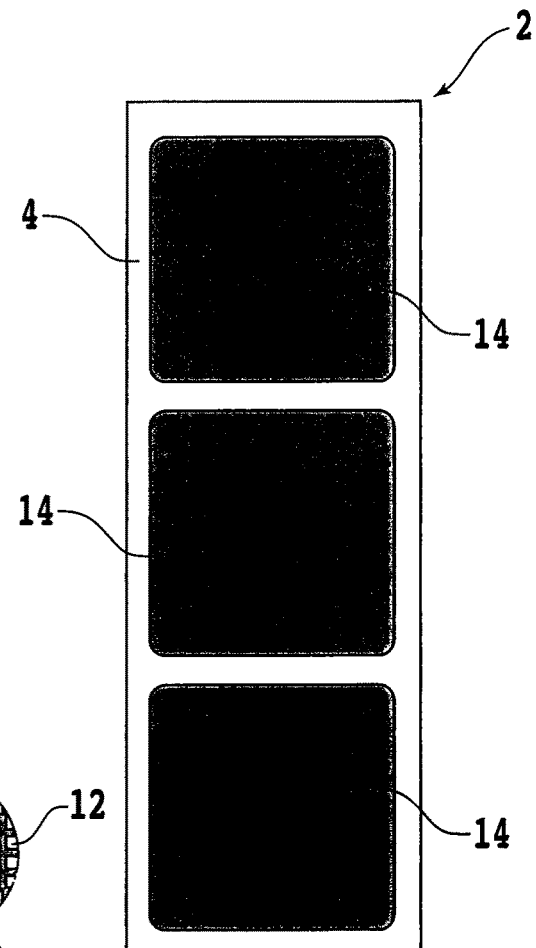
FIG. 1B is a back view of the package substrate.
Figure 1C:
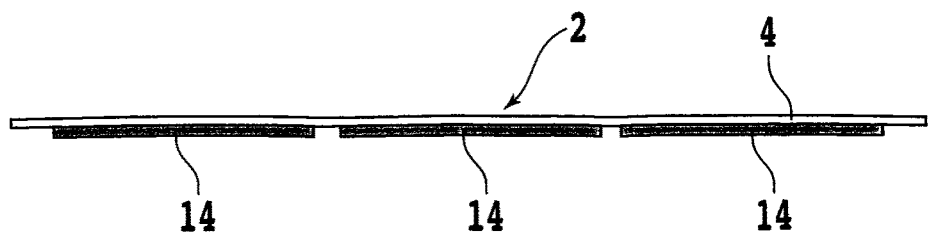
FIG. 1C is a side view of the package substrate.

An embodiment of the present invention will be described in detail below, referring to the drawings. FIG. 1A illustrates a plan view of an example of a package substrate 2 suitable for being processed by a cutting apparatus according to an embodiment of the present invention. FIG. 1B is a back view of the package substrate 2, and FIG. 1C is a side view of the package substrate 2.

The package substrate 2 has a rectangular metallic frame body (lead frame) 4. Three device regions 6a, 6b and 6c in the illustrated example are present in a region surrounded by a peripheral surplus region 5 and non-device regions 5a of the metallic frame body 4. In each of the device regions 6a, 6b and 6c, device chip mounting sections 10 are defined in a plurality of regions partitioned by division lines 8 provided in a crossing pattern such that the division lines 8 are orthogonal to each other, and a plurality of electrodes 12 are formed along four edges of each of the device chip mounting sections 10.

The electrodes 12 are insulated from one another by a molding resin layer 14 molded on the metallic frame body 4. The division lines 8 extending in a first direction and the division lines 8 extending in a second direction orthogonal to the first direction are cut, whereby the electrodes 12 of each device chip are exposed on both sides of the cut grooves.

A device chip (not illustrated) is mounted on the back side of each of the device chip mounting sections 10 in the device regions 6a, 6b and 6c, and electrodes provided in each device chip and the electrodes 12 are connected by bonding wires. The molding resin layer 14 is formed on the back side of each of the device regions 6a, 6b and 6c such that the device chips in the device regions 6a, 6b and 6c are sealed with a resin.

Figure 2:
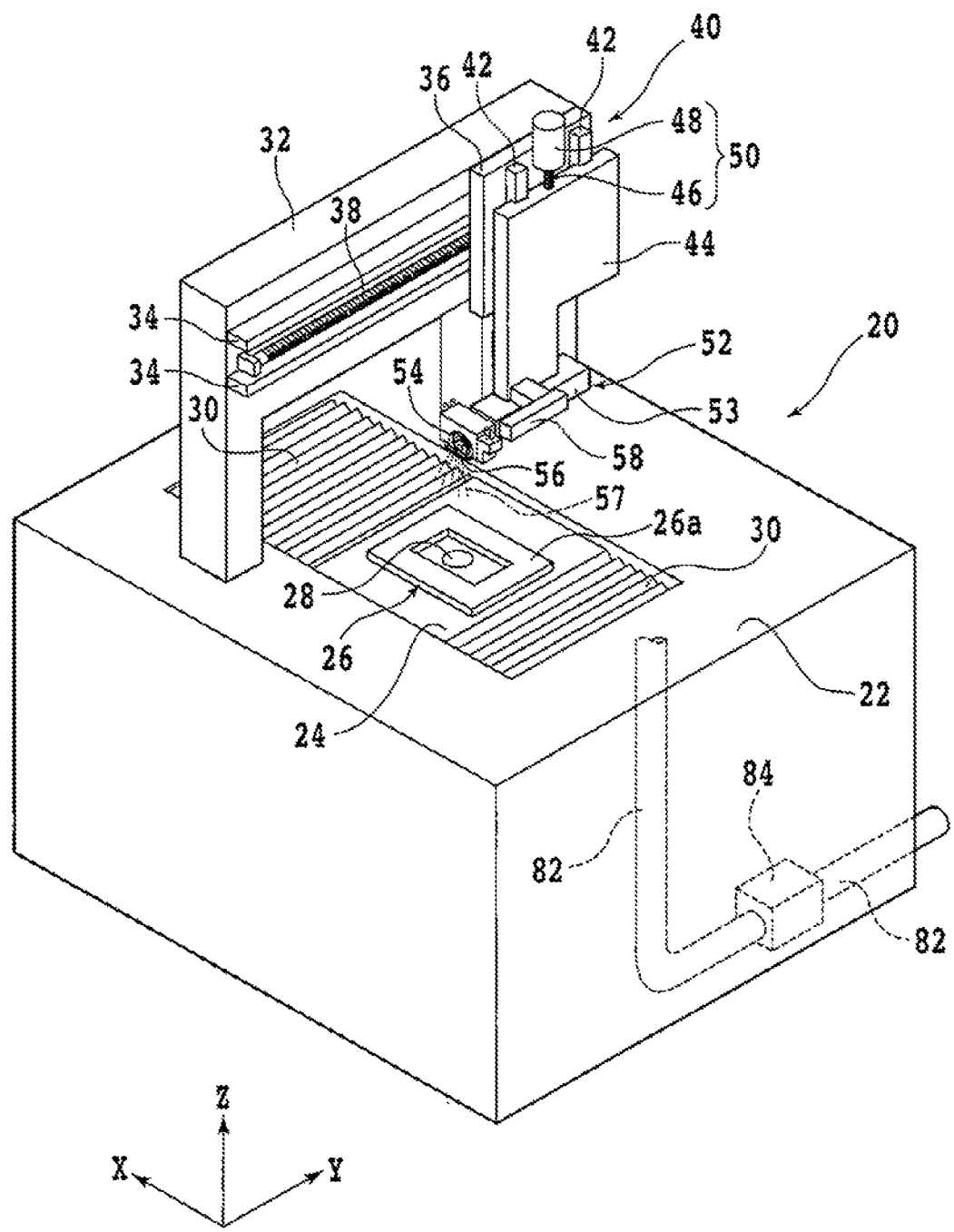
FIG. 2 is a perspective view of a cutting apparatus suitable for cutting the package substrate illustrated in FIG. 1.

FIG. 2 depicts a perspective view of a cutting apparatus 20 according to an embodiment of the present invention. The cutting apparatus 20 illustrated in FIG. 2 is a manual type cutting apparatus in which a workpiece to be cut is placed on holding means and carried out from the holding means by an operator. The reference numeral 22 denotes a base of the cutting apparatus 20. A table base 26 is disposed on the base 22 in such a manner as to be rotatable and be reciprocally movable in an X-axis direction by a cutting feeding mechanism (not illustrated). A suction port 28 connected to a suction source is opened in a substantially central portion of the table base 26.

At the time of processing the package substrate 2, a jig table such as the one disclosed in Japanese Patent Laid-open No. 2011-040542 is placed on the table base 26, and the package substrate 2 is suction-held through the jig table. In other words, in the cutting apparatus of the present embodiment, the table base and the jig table constitute holding means. A water cover 24 is disposed in the surroundings of the table base 26, and bellows 30 for protecting a shaft of the cutting feeding mechanism are connected between the water cover 24 and a water case 60 depicted in FIG. 3.

A gate-formed column 32 is erectly provided on a rear side of the base 22. A pair of guide rails 34 extending in a Y-axis direction are fixed to the column 32. A Y-axis moving block 36 is mounted on the column 32 such as to be movable in the Y-axis direction along the guide rails 34 by a Y-axis moving mechanism (indexing mechanism) 40 including a ball screw 38 and a pulse motor (not illustrated).

A pair of guide rails 42 extending in a Z-axis direction are fixed to the Y-axis moving block 36. A Z-axis moving block 44 is mounted on the Y-axis moving block 36 such as to be movable in the Z-axis direction while being guided along the guide rails 42 by a Z-axis moving mechanism 50 including a ball screw 46 and a pulse motor 48.

A cutting unit 52 as processing means is mounted to the Z-axis moving block 44. A spindle (not illustrated) is rotatably accommodated in a spindle housing 53 of the cutting unit 52, and a cutting blade 54 is detachably attached to a tip portion of the spindle.

A pair of cutting liquid supply nozzles 56 as processing liquid supplying means, which supply processing liquid 57, are disposed on both sides of the cutting blade 54. During cutting of the package substrate 2 held by the holding means 20, the package substrate 2 is cut by the cutting blade 54 while supplying a cutting liquid from the cutting liquid supply nozzles 56. An imaging unit 58 having a microscope and a camera is further mounted to the Z-axis moving block 44. The imaging unit 58 has an imaging camera that images the workpiece using visible rays.

Figure 3:
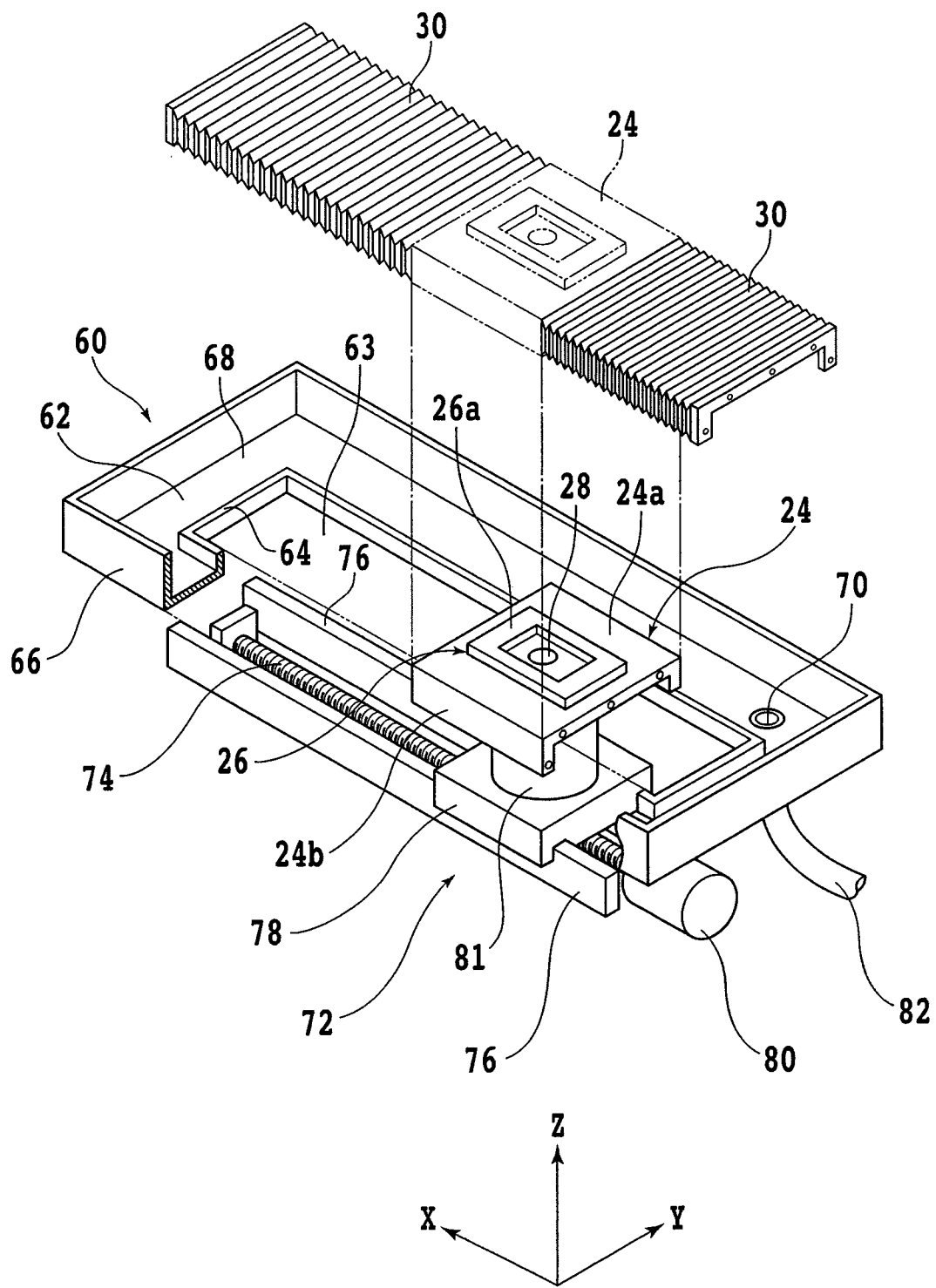
FIG. 3 is a perspective views of cutting feeding means and a water case section of the cutting apparatus.

When the package substrate 2 suction-held by the jig table placed on the table base 26 is cut by the cutting blade 54 while supplying the cutting liquid containing an organic acid and an oxidizing agent from the cutting liquid supply nozzles 56, a cutting waste liquid containing the cutting liquid and cutting swarf flows down into the water case 60 illustrated in FIG. 3 from both ends in regard of a transverse direction (Y-axis direction) of the bellows 30.

The water case 60 is disposed under a moving route of the table base 26. In order to permit the table base 26 to be reciprocated in the X-axis direction, the water case 60 has a rectangular opening 63 provided in a central portion of a bottom plate 62 of a box-like member, and includes a trough section 68 that is defined by the bottom plate 62, an inner peripheral wall 64 and an outer peripheral wall 66 and that serves as a processing waste liquid recovery section for receiving the cutting liquid, and a drain port 70 formed in the bottom plate 62. One end of a drain pipe 82 as a discharge passage extending to the exterior of the water case 60 is connected to the drain port 70.

The water cover 24 has a pair of side plates 24b drooping from both end portions of an upper plate 24a formed in a flat shape, and end portions of the upper plate 24a and the two side plates 24b are slidably engaged with the inner peripheral wall 64 constituting the water case 60.

A cutting feeding mechanism 72 includes a ball screw 74 extending in the X-axis direction, a pair of guide rails 76 disposed in parallel to the ball screw 74, a motor 80 connected to one end of the ball screw 74, and a movable plate 78 which accommodates a nut put in screw engagement with the ball screw 74 and which has bottom portions in sliding contact with the guide rails 76.

When the ball screw 74 is rotated by the motor 80, the movable plate 78 is reciprocally moved in the X-axis direction while being guided by the pair of guide rails 76. A cylindrical member 81 is mounted onto the movable plate 78, and a rotating mechanism that rotates the table base 26 is accommodated in the inside of the cylindrical member 82.

Figure 4A:
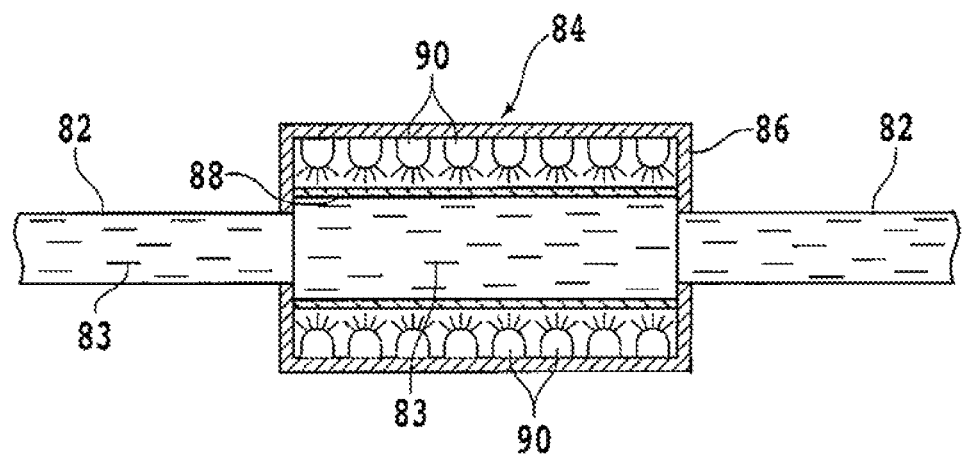
FIG. 4A is a sectional view illustrating a first embodiment of waste liquid treating means.

As illustrated in FIG. 4A, a waste liquid treatment mechanism (waste liquid treating means) 84 that decomposes the cutting liquid contained in the cutting waste liquid while the cutting waste liquid (processing waste liquid 83) flows through the drain pipe 82, connected to the drain port 70 of the water case 60, is disposed at an intermediate portion of the drain pipe 82. The waste liquid treatment mechanism 84 includes a casing 86 connected to the drain pipe 82, a cylindrical inner peripheral wall 88 formed from a transparent member, and a plurality of light emitting diode (LED) lamps 90 as UV ray irradiating means disposed while being spaced apart in a longitudinal direction and a circumferential direction of the casing 86. The LED lamps 90 irradiate the cutting waste liquid flowing inside the inner peripheral wall 89 with UV rays, to decompose the cutting liquid (processing liquid) contained in the cutting waste liquid (processing waste liquid 83).

At the time of cutting the package substrate 2 as depicted in FIG. 1 by the cutting apparatus 2 according to the embodiment of the present invention, cutting is performed while supplying the cutting liquid containing the organic acid and the oxidizing agent to a processing point at which the cutting blade 54 cuts into the package substrate 2.

By the organic acid contained in the cutting liquid, cutting of the package substrate 2 can be performed while modifying the metal contained in the package substrate 2 and thereby suppressing the ductility of the metal. Therefore, burring from the metal would not be caused by the cutting. In addition, the use of the oxidizing agent makes it possible to oxidize the surface of the metal, thereby to lower the ductility of the metal, and enhance the processability of the metal surface.

As the organic acid, there can be used, for example, those compounds which have at least one carboxyl group and at least one amino group in the molecule thereof. In this case, at least one of the amino groups is preferably a secondary or tertiary amino group. Besides, the compound used as the organic acid may have a substituent group.

Examples of an amino acid which can be used as the organic acid include glycine, dihydroxyethylglycine, glycylglycine, hydroxyethylglycine, N-methylglycine, β-alanine, L-alanine, L-2-aminobutyric acid, L-norvaline, L-valine, L-leucine, L-norleucine, L-alloisoleucine, L-isoleucine, L-phenylalanine, L-proline, sarcosine, L-ornithine, L-lysine, taurine, L-serine, L-threonine, L-allothreonine, L-homoserine, L-thyroxine, L-tyrosine, 3,5-diiodo-L-tyrosine, β-(3,4-dihydroxyphenyl)-L-alanine, 4-hydroxy-L-proline, L-cysteine, L-methionine, L-ethionine, L-lanthionine, L-cystathionine, L-cystine, L-cysteic acid, L-glutamic acid, L-aspartic acid, S-(carboxymethyl)-L-cysteine, 4-aminobutyric acid, L-asparagine, L-glutamine, azaserine, L-canavanine, L-citrulline, L-arginine, δ-hydroxy-L-lysine, creatine, L-kynurenine, L-histidine, 1-methyl-L-histidine, 3-methyl-L-histidine, L-tryptophan, actinomycin C1, ergothioneine, apamin, angiotensin I, angiotensin II, and antipain. Among these, preferred are glycine, L-alanine, L-proline, L-histidine, L-lysine, and dihydroxyethylglycine.

In addition, examples of an aminopoly-acid which can be used as the organic acid include iminodiacetic acid, nitrilotriacetic acid, diethylenetriaminepentaacetic acid, ethylenediaminetetraacetic acid, hydroxyethyliminodiacetic acid, nitrilotrismethylenephosphonic acid, ethylenediamine-N,N,N',N'-tetramethylenesulfonic acid, 1,2-diaminopropanetetraacetic acid, glycol ether-diaminetetraacetic acid, transcyclohexanediaminetetraacetic acid, ethylenediamineorthohydroxyphenylacetic acid, ethylenediaminedisuccinic acid (SS body), β-alaninediacetic acid, N-(2-carboxylatoethyl)-L-aspartic acid, N,N'-bis(2-hydroxybenzyl)ethylenediamine-N,N'-diacetic acid.

Further, examples of a carboxylic acid which can be used as the organic acid include saturated carboxylic acids such as formic acid, glycolic acid, propionic acid, acetic acid, butyric acid, valeric acid, hexanoic acid, oxalic acid, malonic acid, glutaric acid, adipic acid, malic acid, succinic acid, pimelic acid, mercaptoacetic acid, glyoxylic acid, chloroacetic acid, pyruvic acid, acetoacetic acid, and glutaric acid, unsaturated carboxylic acids such as acrylic acid, methacrylic acid, crotonic acid, fumaric acid, maleic acid, mesaconic acid, citraconic acid, and aconitic acid, and cyclic unsaturated carboxylic acids such as benzoic acids, toluic acid, phthalic acid, naphthoic acid, pyromellitic acid, and naphthalic acid.

Examples of a compound which can be used as the oxidizing agent include hydrogen peroxide, peroxides, nitrates, iodates, periodates, hypochlorites, chlorites, chlorates, perchlorates, persulfate, dichromates, permanganates, cerium salts, vanadates, ozone water, silver (II) salts, iron (III) salts and their organic complex salts.

In addition, an anticorrosive may be mixed in the cutting liquid. With the anticorrosive mixed, corrosion (elution) of the metal contained in the QFN substrate 10 can be prevented. As the anticorrosive, there is preferably used, for example, a heterocyclic aromatic compound having at least three nitrogen atoms in its molecule and having a condensed ring structure, or a heterocyclic aromatic compound having at least four nitrogen atoms in its molecule. Further, the aromatic ring compound preferably contains a carboxyl group, a sulfo group, a hydroxy group, or an alkoxy group. Specifically, the aromatic ring compound is preferably one of tetrazole derivatives, 1,2,3-triazole derivatives, and 1,2,4-triazole derivatives.

Examples of the tetrazole derivatives which can be used as the anticorrosive include those which have no substituent group on the nitrogen atoms forming the tetrazole ring and in which an alkyl group substituted by a substituent group selected from the group consisting of a sulfo group, an amino group, a carbamoyl group, a carbonamide group, a sulfamoyl group and a sulfonamide group or at least one substituent group selected from the group consisting of a hydroxy group, a carboxy group, a sulfo group, an amino group, a carbamoyl group, a carbonamide group, a sulfamoyl group and a sulfonamide group is introduced to the 5-position of tetrazole.

Besides, examples of the 1,2,3-triazole derivatives which can be used as the anticorrosive include those which have no substituent group on the nitrogen atoms forming the 1,2,3-triazole ring and in which an alkyl or aryl group substituted by a substituent group selected from the group consisting of a hydroxy group, a carboxy group, a sulfo group, an amino group, a carbamoyl group, a carbonamide group, a sulfamoyl group and a sulfonamide group or at least one substituent group selected from the group consisting of a hydroxy group, a carboxy group, a sulfo group, an amino group, a carbamoyl group, a carbonamide group, a sulfamoyl group and a sulfonamide group is introduced to the 4-position and/or the 5-position of 1,2,3-triazole.

In addition, examples of the 1,2,4-triazole derivatives which can be used as the anticorrosive include those which have no substituent group on the nitrogen atom forming the 1,2,4-triazole ring and in which an alkyl or aryl group substituted by a substituent group selected from the group consisting of a sulfo group, a carbamoyl group, a carbonamide group, a sulfamoyl group and a sulfonamide group or at least one substituent group selected from the group consisting of a hydroxy group, a carboxy group, a sulfo group, an amino group, a carbamoyl group, a carbonamide group, a sulfamoyl group and a sulfonamide group is introduced to the 2-position and/or the 5-position of 1,2,4-triazle.

Since the oxidizing agent is contained in the cutting liquid supplied from the cutting liquid supply nozzles 56 as aforementioned, microorganisms in a conventional biological treatment using microorganisms are killed by the oxidizing agent, so that the organic matter in the cutting waste liquid may not be decomposed and the cutting waste liquid not satisfying the waste liquid quality standards may be discharged.

However, in the waste liquid treatment mechanism 84 of a first embodiment illustrated in FIG. 4A, the cutting waste liquid flowing through the drain pipe 82 is irradiated with UV rays from the plurality of LED lamps 90, whereby the organic matter in the cutting waste liquid can be decomposed, so that the risk of discharging a cutting waste liquid not satisfying the waste liquid quality standards can be eliminated. The wavelength of the UV rays is preferably not more than 340 nm, more preferably not more than 300 nm.

Figure 4B:
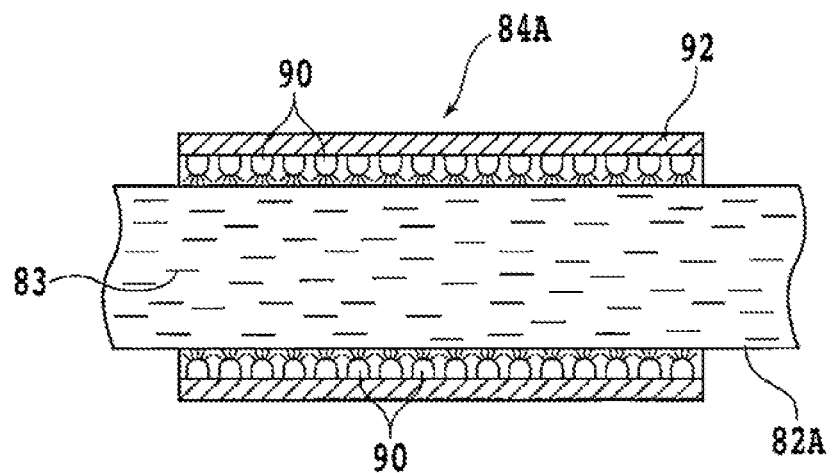
FIG. 4B is a sectional view illustrating a second embodiment of the waste liquid treating means.

FIG. 4B illustrates a sectional view of a waste liquid treatment mechanism 84A of a second embodiment of the present invention. In the present embodiment, a drain pipe 82A is formed from a material which is transparent to UV rays. Besides, the periphery of the transparent drain pipe 82A is surrounded by a casing 92. In the casing 92, a plurality of LED lamps 90 for irradiation with UV rays are disposed while being spaced apart in the longitudinal direction and the circumferential direction of the casing.

In the waste liquid treatment mechanism 84A of the present embodiment, also, the cutting waste liquid flowing through the transparent drain pipe 82A is irradiated with UV rays from the LED lamps 90, so that the organic matter in the cutting waste liquid can be effectively decomposed, and the risk of discharging a cutting waste liquid not satisfying the waste liquid quality standards can be eliminated.

When the package substrate 2 is cut while supplying the cutting liquid containing the organic acid and the oxidizing agent by the cutting apparatus 20 provided with the aforementioned waste liquid treatment mechanism 84 or 84A, not an additive but optical energy having a decomposition wavelength is utilized for decomposition of the oxidizing agent, whereby the need for the additive and temperature management can be eliminated, and the running cost can be suppressed to a low level.

While an example in which the waste liquid treatment mechanism performing irradiation with UV rays is used for waste liquid treatment in a cutting apparatus has been described in the above embodiments, the waste liquid treatment mechanism of the present invention is not to be applied only to a cutting apparatus, but is applicable also to other processing apparatuses such as a grinding apparatus and a cutting tool cutting apparatus.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing apparatus comprising:
   holding means holding a workpiece;
   processing means processing the workpiece held by the holding means;
   processing liquid supplying means supplying a processing liquid containing at least an oxidizing agent to the workpiece held by the holding means when processing the workpiece by the processing means;
   a processing waste liquid recovery section recovering a processing waste liquid containing the processing liquid supplied from the processing liquid supplying means to the workpiece;
   a discharge passage through which the processing waste liquid is discharged from the processing waste liquid recovery section to an outside of the processing apparatus; and
   a waste liquid treatment mechanism disposed in the discharge passage and decomposing the processing liquid contained in the processing waste liquid while the processing waste liquid flows through the discharge passage, such that the decomposed processing liquid is passed through the discharge passage to the outside of the processing apparatus,
   wherein the waste liquid treatment mechanism includes ultraviolet irradiation means configured and arranged for irradiating the processing waste liquid with ultraviolet rays.

2. The processing apparatus according to claim 1, wherein the oxidizing agent is hydrogen peroxide.

3. The processing apparatus according to claim 2, wherein the ultraviolet rays irradiated by the ultraviolet ray irradiation means have a wavelength of not more than 300 nm.

4. The processing apparatus according to claim 1, wherein the ultraviolet rays irradiated by the ultraviolet ray irradiation means have a wavelength of not more than 300 nm.

5. A processing apparatus comprising:
   holding means holding a workpiece;
   processing means processing the workpiece held by the holding means;
   processing liquid supplying means supplying a processing liquid containing at least an oxidizing agent to the workpiece held by the holding means when processing the workpiece by the processing means;
   a processing waste liquid recovery section recovering a processing waste liquid containing the processing liquid supplied from the processing liquid supplying means to the workpiece;
   a discharge passage through which the processing waste liquid is discharged from the processing waste liquid recovery section to an outside of the processing apparatus; and
   a waste liquid treatment mechanism disposed in the discharge passage and decomposing the processing liquid contained in the processing waste liquid while the processing waste liquid flows through the discharge passage such that the decomposed processing liquid is passed through the discharge passage to the outside of the processing apparatus,
   wherein the waste liquid treatment mechanism includes ultraviolet irradiation means configured and arranged for irradiating the processing waste liquid with ultraviolet rays, and
   wherein the waste liquid treatment mechanism includes a transparent wall configured and arranged to permit the ultraviolet rays from the ultraviolet ray irradiation means to act upon the processing waste liquid.

6. A processing apparatus comprising:
   holding means holding a workpiece;
   processing means processing the workpiece held by the holding means;
   processing liquid supplying means supplying processing liquid containing at least an oxidizing agent to the workpiece held by the holding means when processing the workpiece by the processing means;
   a processing waste liquid recovery section recovering a processing waste liquid containing the processing liquid supplied from the processing liquid supplying means to the workpiece;
   a discharge passage through which the processing waste liquid is discharged from the processing waste liquid recovery section to an outside of the processing apparatus; and
   a waste liquid treatment mechanism disposed in the discharge passage and decomposing the processing liquid contained in the processing waste liquid while the processing waste liquid flows through the discharge passage, such that the decomposed processing liquid is passed through the discharge passage to the outside of the processing apparatus,
   wherein the waste liquid treatment mechanism includes ultraviolet irradiation means configured and arranged for irradiating the processing waste liquid with ultraviolet rays, and
   wherein the waste liquid treatment mechanism includes a transparent drain pipe configured and arranged to permit the ultraviolet rays from the ultraviolet ray irradiation means to act upon the processing waste liquid.

7. A processing apparatus comprising:
   holding means holding a workpiece;
   processing means processing the workpiece held by the holding means;
   processing liquid supplying means supplying a processing liquid containing at least an oxidizing agent to the workpiece held by the holding means when processing the workpiece by the processing means;
   a processing waste liquid recovery section recovering a processing waste liquid containing the processing liquid supplied from the processing liquid supplying means to the workpiece;
   a discharge passage through which the processing waste liquid is discharged from the processing waste liquid recovery section to an outside of the processing apparatus; and a waste liquid treatment mechanism disposed in the discharge passage and decomposing the processing liquid contained in the processing waste liquid while the processing waste liquid flows through the discharge passage, such that the decomposed processing liquid is passed through the discharge passage to the outside of the processing apparatus, wherein the waste liquid treatment mechanism includes ultraviolet ray irradiation means irradiating the processing waste liquid with ultraviolet rays at a wavelength of not more than 340 nm.

* * * * *